United States Patent [19]

Pumo et al.

[11] Patent Number: 4,663,545

[45] Date of Patent: May 5, 1987

[54] HIGH SPEED STATE MACHINE

[75] Inventors: Joseph Pumo; William D. Atwell, Jr., both of Austin; Doyle V. McAlister, Pflugerville, all of Tex.

[73] Assignee: Motorola, Inc., Schaumburg, Ill.

[21] Appl. No.: 672,539

[22] Filed: Nov. 15, 1984

[51] Int. Cl.[4] .................. H03K 3/284; H03K 17/16; G11C 8/00; G01N 23/20
[52] U.S. Cl. .......................... 307/463; 307/272 R; 307/443; 377/79; 377/105
[58] Field of Search .............. 307/463, 440, 445, 481, 307/272 R, 443; 377/78, 79, 104, 105

[56] References Cited

U.S. PATENT DOCUMENTS 3,862,435 1/1975 Salters et al. ..................... 377/79
3,876,982 4/1975 Morrien ............................ 377/78

Primary Examiner—Stanley D. Miller
Assistant Examiner—M. R. Wambach
Attorney, Agent, or Firm—John A. Fisher; Jeffrey Van Myers

[57] ABSTRACT

A state machine in which the next state signals are biased by the next state encoder very close to the switch voltage of the input transistors of the present state latches to improve the response time of the state machine. Charge sharing on the outputs of the next state selector is prevented from affecting the biased next state signals by voltage substaining circuitry. By pre-encoding input signals pertinent to each state using separate input logic, the size of the next state selector is minimized, further improving the response time of the state machine. Selected present state latches may be prevented from changing state by gating the next state signals.

8 Claims, 3 Drawing Figures

HIGH SPEED STATE MACHINE

FIELD OF THE INVENTION

The present invention relates generally to a state machine, and, more particularly, to a state machine which rapidly switches to the next state.

BACKGROUND ART

In typical state machines, the present state latches switch to the next state only after the next state input signals have changed by a significant proportion of the supply voltage. Thus, for example, in an NMOS embodiment powered by a +5 volt supply, the present state latches will change state only after the next state input signals have changed about, 2.5 volts relative to the supply rails. In this form, this rate of change is largely dependent upon the size of the transistors in the drivers of the next state input signals. However, increasing the size of these transistors also increases the respective gate capacitances, requiring additional drive capability in the next state input logic transistors. This in turn impacts the size of the present state decode logic transistors and ultimately the output drive of the present state latches. Thus, speed of operation is obtained at the expense of silicon area and power dissipation.

SUMMARY OF THE INVENTION

Accordingly, it is an object of the present invention to provide a state machine in which the inputs to the present state latches are biased to increase speed of transistion.

Another object of the present invention is to provide a state machine having a next state selector and a next state encoder which are highly optimized in order to increase the response time thereof.

In carrying out these and other objects of the present invention, there is provided, in one form, a state machine comprising a present state latch, a present state decoder, a next state selector and a next state encoder. The present state latch, which is responsive to the voltage of a next state signal relative to a predetermined switch voltage, stores the state of the next state signal in response to a first clock signal. Thereafter, the present state latch provides a present state signal in response to a second clock signal, the present state signal having a state related to the state of the stored next state signal. The present state decoder, which is responsive to the state of the present state signal provided by the present state latch, provides a present state control signal in response to the first clock signal, the present state control signal having a state related to the state of the present state signal. The next state selector, which is responsive to the state of the present state control signal provided by the present state decoder and at least a first input signal generated externally to the state machine, provides a next state select signal in response to the first clock signal, the next state select signal having a state related to a predetermined logical combination of the states of the present state control signal and the first input signal. Thereafter, the next state selector forces the next state select signal to a predetermined state in response to the second clock signal. The next state encoder, which is responsive to the state of the next state select signal provided by the next state selector, provides the next state signal to the present state latch in response to the first clock signal, the next state signal having a state related to the state of the next state select signal. The next state encoder thereafter forces the next state signal to a predetermined initial voltage relative to the predetermined switch voltage in response to the second clock signal. In accordance with the present invention, the next state encoder includes biasing circuitry which establishes the initial voltage relatively close to said switch voltage. In the preferred form, the next state encoder also includes a sustaining circuit for maintaining the initial voltage. In addition, the next state encoder may be responsive directly to an input signal. If desired, input logic may be provided to reduce the number of inputs to the next state selector.

DESCRIPTION OF THE INVENTION

Figure 1:
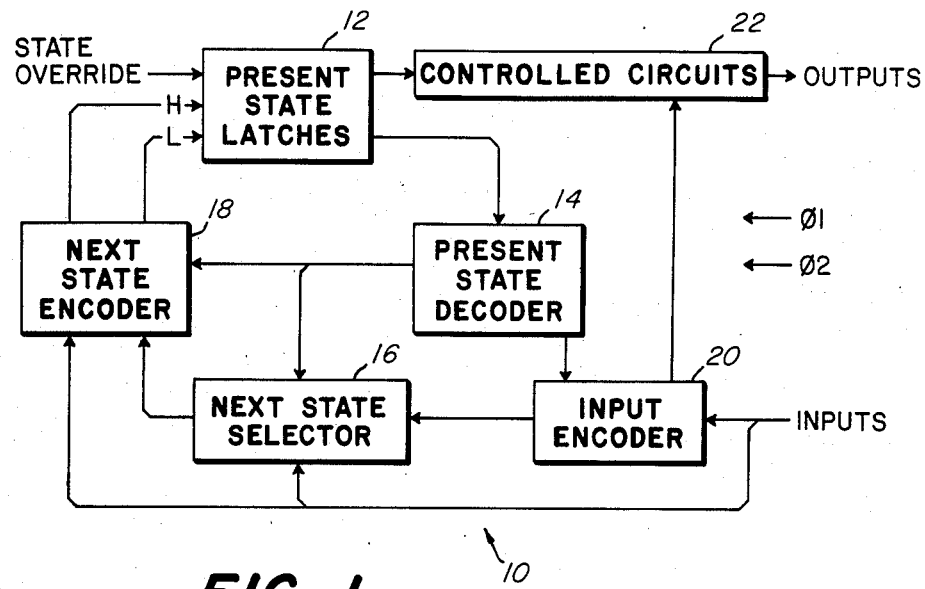
FIG. 1 is a block diagram of a state machine in accordance with the present invention.

Shown in FIG. 1 is a state machine 10 which changes state generally in synchronization with a pair of clock signals $\phi 1$ and $\phi 2$. In general, the state machine comprises one or more present state latches 12, a present state decoder 14, a next state selector 16 and a next state encoder 18. In the preferred form, the state machine 10 includes an input encoder 20 and one or more controlled circuits 22.

In operation, the present state of the state machine 10 is indicated by a present state signal provided by the present state latches 12. This present state signal may be used by the controlled circuits 22 to control the generation of appropriate outputs and the like. This present state signal is also decoded by the present state decoder 14 to generate a next state control signal. This next state control signal is logically combined by the next state selector 16 with selected inputs generated externally to the state machine 10 to derive a next state select signal. Preferably, the next state control signal is logically combined by the input encoder 20 with one or more of those inputs which are relatively static in order to reduce the inputs which must be handled directly by the next state input logic 16. The next state select signal is encoded by the state encoder 18 to derive the next state signal to be stored into the present state latches 12. In appropriate circumstances, the next state encoder 18 may instead directly encode one or more of the inputs, or the next state control signal per se, to derive the next state signal. In this manner, the sequencing of the state machine 10 through the various states is dependent upon both the present state of the state machine 10 and those inputs which are important in that state.

Figure 2A:
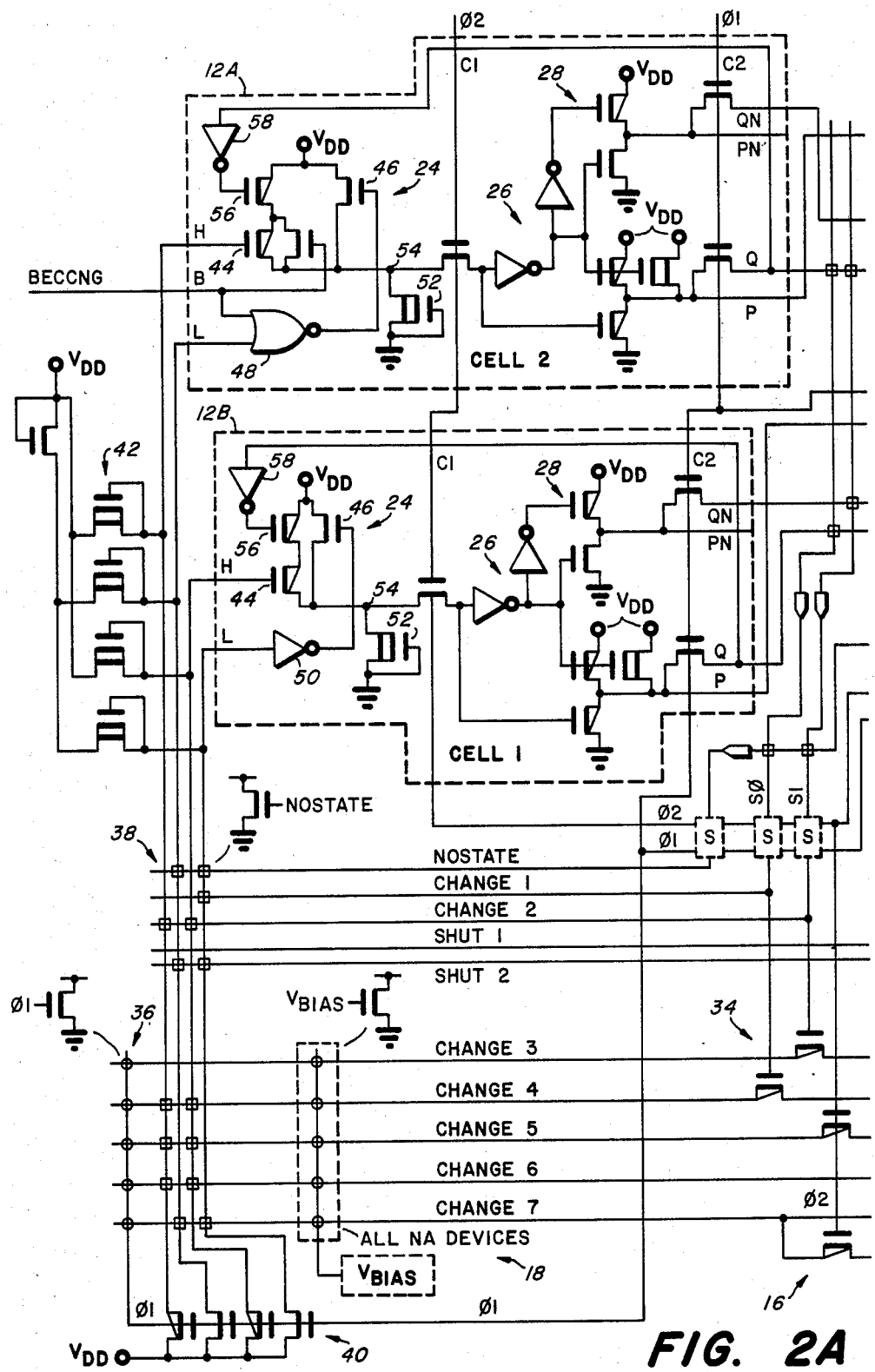
FIGS. 2A and 2B, when placed side by side comprise a schematic diagram of the state machine of FIG. 1.

In the portion of preferred embodiment shown in FIG. 2A, each of the present state latches 12A–12B comprises an asynchronous input portion 24, a storage portion 26 which is controlled by the clock signal $\phi 2$, and an output portion 28 which is controlled by the clock signal $\phi 1$. In general, the input portion 24 of each of the present state latches 12A and 12B continuously responds to changes in the voltage of a respective pair of next state signals (H and L) relative to respective predetermined switch voltages. However, only upon being disabled by the trailing edge of clock signal $\phi 2$ will the storage portion 26 of each present state latch 12A–12B actually "store" the then-current state of the next state signal seen by the respective input portion 24. Upon thereafter being enabled by the leading edge of clock signal $\phi 1$, the output portion 28 of each present state latch 12A-12B will provide complementary present state signals (Q and QN) the states of which are related to the state of the next state signal which was last stored by the respective storage portion 26.

Figure 2B:
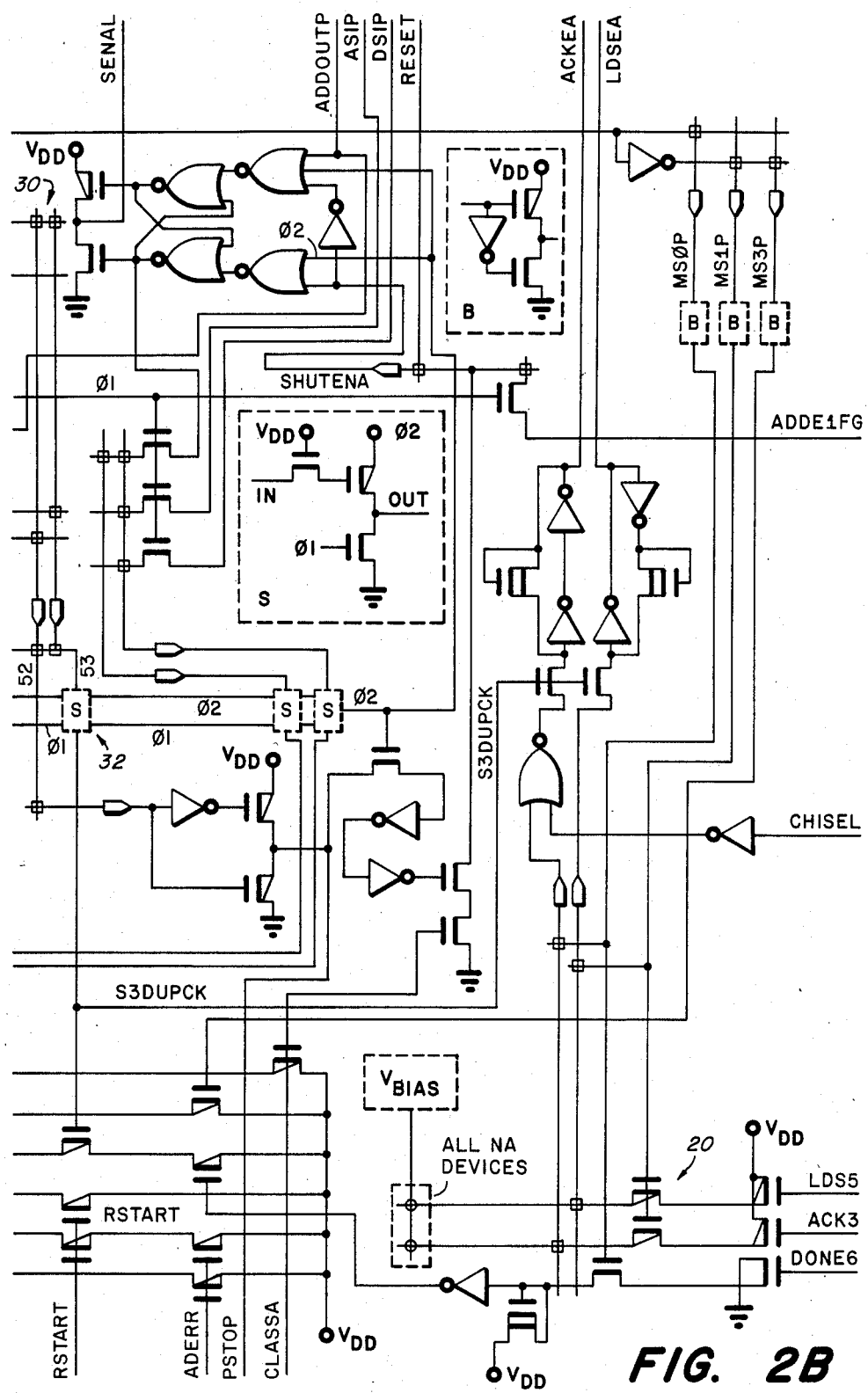

The preferred form of the present state decoder 14, shown spanning FIGS. 2A and 2B includes an decoder portion 30 constructed substantially similar to a conventional programmable logic array (PLA), and a set of state drivers (S) 32 which are controlled by both clock signals $\phi 1$ and $\phi 2$. In general, the decoder portion 30 of the present state decoder 14 continuously responds to the states of the several present state signals provided by the output portions 28 of the present state latches 12A-12B. Each time the several state drivers 32 are disabled by the clock signal $\phi 1$, the respective present state control signals are forced to a predetermined state, i.e. ground. Upon being thereafter enabled by the next clock signal $\phi 2$, the state drivers 32 will provide the particular configuration of present state control signals appropriate for then-current states of the several present state signals.

Preferably, the next state selector 16, also spanning FIGS. 2A and 2B, comprises a logic portion 34 consisting of one or more sets of transistors which are connected in series to form respective AND gates, and a control portion 36 which is controlled by the clock signal $\phi 1$. In general, the logic portion 34 of the next state selector 16 continuously responds to the states of the several present state control signals provided by the state drivers 32 and to the states of one or more input signals generated by other logic (not shown) external to the state machine 10. Each time the control portion 36 is enabled by the clock signal $\phi 1$, all of the next state select signals are forced to a predetermined state, i.e. ground. Upon the control portion 36 being thereafter disabled (by the trailing edge of clock signal $\phi 1$), the logic portion 34 will provide the particular configuration of next state select signals appropriate for the several logical combinations of the present state control signal(s) and the input signal(s).

In the preferred form, the next state encoder 18, shown in FIG. 2A, comprises an encoder portion 38 constructed somewhat similar to a conventional read-only-memory (ROM), and a control portion 40 controlled by the clock signal $\phi 1$. In general, the encoder portion 38 continuously responds to the states of the several next state select signals provided by the next state selector 16. Recall, however, that the several next state select signals are periodically forced to ground by the control portion 36 of the next state selector 16 in response to clock signal $\phi 1$. Thus, upon being simultaneously enabled by clock signal $\phi 1$, the control portion 40 of the next state encoder 18 is able to force each pair of next state signals (H and L) to respective predetermined initial voltages relatively close to the corresponding switch voltages of the input portions 24 of the present state latches 12A-12B. Thus, upon the control portion 40 (and control portion 36) being thereafter disabled (by the trailing edge of clock signal $\phi 1$), the encoder portion 38 will rapidly provide the particular configuration of next state signals (H and L) appropriate for the states of the several next state select signals. In order to prevent charge sharing within the next state selector 16 from causing erroneous next state signals, the next state encoder 18 preferably includes a sustaining portion 42 which substantially maintains the initial voltages of the H and L signals.

In the preferred form of the present state latches 12A-12B shown in FIG. 2A, each of the H signals is coupled to the gate of a respective natural transistor 44, while the corresponding L signal is coupled to the gate of a respective natural transistor 46, either by a conventional NOR gate 48 as in present state latch 12A or by a conventional inverter 50 as in present state latch 12B. Recall that each of the H and L signals are periodically precharged relatively high by the control portion 40. If the H signal thereafter goes low while the L signal stays high, both of the transistors 44 and 46 will be off, allowing a depletion transistor 52 to pull an output node 54 low. If, on the other hand, the H signal stays high and the L signal goes low, transistor 46 will turn on, overpowering transistor 52 and pulling output node 54 high. Note that this will occur even if the H signal also goes low. Thus, each of the present state latches 12A-12B are reset dominant. However, in the present state latch 12A, transistor 46 cannot be turned on if the asynchronous input signal coupled to the other input of the NOR gate 48 goes low. In this manner, the next state signals can be prevented from affecting the state stored in the present state latch 12A. If, during any $\phi 1$-$\phi 2$ cycle, neither the H signal or the L signal goes low, the current state of each of the present state latches 12A-12B will be maintained by a natural transistor 56 acting in conjunction with an inverter 58 whioh is responsive to the respective output portion 28.

By way of example, assume a typical Vdd of +5.0 volts. By the trailing edge of clock signal $\phi 1$, each H line will typically be biased to about +4.5 volts, while each L line will typically be biased to about +3.0 volts. However, since the switch point of the transistor 44 will be on the order of about +3.9 volts, the H line must be discharged only about +0.6 volts before transistor 44 will turn off sufficiently to allow transistor 52 to pull the output node 54 low. SimilarlY, since the switch point of the NOR gate 48 and the inverter 50 will be on the order of about +2.0 volts, the L line must be discharged only about +1.0 volts before the transistor 46 will be turned on sufficiently to overpower transistor 52 and maintain the output node 54 high. In this manner, the control portion 40, with the assistance of the sustaining portion 42, effectively biases the next state signals (H and L) so that the present state latches 12A-12B respond very rapidly to the outputs of the next state selector 16.

We claim:
1. In a state machine comprising:
a present state latch, responsive to the voltage of a next state signal relative to a predetermined switch voltage, for storing the state of the next state signal in response to a first clock signal, the present state latch providing a present state signal in response to a second clock signal, the present state signal having a state related to the state of the stored next state signal;
a present state decoder, responsive to the state of the present state signal provided by the present state latch, for providing a present state control signal in response to the first clock signal, the present state control signal having a state related to the state of the present state signal;
a next state selector, responsive to the state of the present state control signal provided by the present state decoder and at least a first input signal generated externally to the state machine, for providing a next state select signal in response to the first clock signal, the next state select signal having a state related to a predetermined logical combination of the states of the present state control signal and the first input signal, the next state selector thereafter forcing the next state select signal to a predetermined state in response to the second clock signal; and a next state encoder, responsive to the state of the next state select signal provided by the next state selector, for providing the next state signal to the present state latch in response to the first clock signal, the next state signal having a state related to the state of the next state select signal, the next state encoder thereafter forcing the next state signal to a predetermined initial voltage relative to the predetermined switch voltage in response to the second clock signal;

the improvement comprising:

control means, in the next state encoder, for establishing the initial voltage relatively close to said switch voltage, in response to said second clock signal.

2. The state machine of claim 1 further comprising:

sustaining means, in the next state encoder, for sustaining the initial voltage established on the next state signal by the control means relatively close to said switch voltage in the absence of the next state select signal.

3. The state machine of claim 1 further comprising:

means, in the present state latch, for preventing the next state signal from affecting the state stored in the present state latch.

4. The state machine of claim 1 further comprising:

means, in the next state encoder and responsive to a second input signal generated externally to the state machine, for providing a second next state signal to the present state latch independent of the next state select signal provided by the next state selector.

5. The state machine of claim 1 further comprising:

logic means, responsive to the present state control signal and to a second input signal generated externally to the state machine, for logically combining the second input signal and the present state control signal and providing the resultant signal to the next state input logic as the first input signal.

6. In a state machine comprising:

a present state latch, responsive to the voltage of a next state signal relative to a predetermined switch voltage, for storing the state of the next state signal in response to a first clock signal, the present state latch providing a present state signal in response to a second clock signal, the present state signal having a state related to the state of the stored next state signal;

a present state decoder, responsive to the state of the present state signal provided by the present state latch, for providing a present state control signal in response to the first clock signal, the present state control signal having a state related to the state of the present state signal;

a next state selector, responsive to the state of the present state control signal provided by the present state decoder and at least a first input signal generated externally to the state machine, for providing a next state select signal in response to the first clock signal, the next state select signal having a state related to a predetermined logical combination of the states of the present state control signal and the first input signal, the next state selector thereafter forcing the next state select signal to a predetermined state in response to the second clock signal; and a next state encoder, responsive to the state of the next state select signal provided by the next state selector, for providing the next state signal to the present state latch in response to the first clock signal, the next state signal having a state related to the state of the next state select signal, the next state encoder thereafter forcing the next state signal to a predetermined initial voltage relative to the predetermined switch voltage in response to the second clock signal;

the improvement comprising:

means, in the present state latch, for preventing the next state signal from affecting the state stored in the present state latch in response to a control signal.

7. In a state machine comprising:

a present state latch, responsive to the voltage of a next state signal relative to a predetermined switch voltage, for storing the state of the next state signal in response to a first clock signal, the present state latch providing a present state signal in response to a second clock signal, the present state signal having a state related to the state of the stored next state signal;

a present state decoder, responsive to the state of the present state signal provided by the present state latch, for providing a present state control signal in response to the first clock signal, the present state control signal having a state related to the state of the present state signal;

a next state selector, responsive to the state of the present state control signal provided by the present state decoder and at least a first input signal generated externally to the state machine, for providing a next state select signal in response to the first clock signal, the next state select signal having a state related to a predetermined logical combination of the states of the present state control signal and the first input signal, the next state selector thereafter forcing the next state select signal to a predetermined state in response to the second clock signal; and a next state encoder, responsive to the state of the next state select signal provided by the next state selector, for providing the next state signal to the present state latch in response to the first clock signal, the next state signal having a state related to the state of the next state select signal, the next state encoder thereafter forcing the next state signal to a predetermined initial voltage relative to the predetermined switch voltage in response to the second clock signal;

the improvement comprising:

means, in the next state encoder and responsive to a second input signal generated externally to the state machine, for providing a second next state signal to the present state latch independent of the next state select signal provided by the next state selector.

8. In a state machine comprising:

a present state latch, responsive to the voltage of a next state signal relative to a predetermined switch voltage, for storing the state of the next state signal in response to a first clock signal, the present state latch providing a present state signal in response to a second clock signal, the present state signal having a state related to the state of the stored next state signal;

a present state decoder, responsive to the state of the present state signal provided by the present state latch, for providing a present state control signal in response to the first clock signal, the present state control signal having a state related to the state of the present state signal;

a next state selector, responsive to the state of the present state control signal provided by the present state decoder and at least a first input signal generated externally to the state machine, for providing a next state select signal in response to the first clock signal, the next state select signal having a state related to a predetermined logical combination of the states of the present state control signal and the first input signal, the next state selector thereafter forcing the next state select signal to a predetermined state in response to the second clock signal; and a next state encoder, responsive to the state of the next state select signal provided by the next state selector, for providing the next state signal to the present state latch in response to the first clock signal, the next state signal having a state related to the state of the next state select signal, the next state encoder thereafter forcing the next state signal to a predetermined initial voltage relative to the predetermined switch voltage in response to the second clock signal;

the improvement comprising:

logic means, responsive to the present state control signal and to a second input signal generated externally to the state machine, for logically combining the second input signal and the present state control signal and providing the resultant signal to the next state selector as the first input signal.

* * * * *